US008937366B1

(12) United States Patent
Han et al.

(10) Patent No.: US 8,937,366 B1
(45) Date of Patent: Jan. 20, 2015

(54) SELECTIVE EPITAXIAL OVERGROWTH COMPRISING AIR GAPS

(75) Inventors: Sang M. Han, Albuquerque, NM (US); Darin Leonhardt, Albuquerque, NM (US); Swapnadip Ghosh, Albuquerque, NM (US)

(73) Assignee: STC.UNM, Albuquerque, NM (US)

( * ) Notice: Subject to any disclaimer, the term of this patent is extended or adjusted under 35 U.S.C. 154(b) by 104 days.

(21) Appl. No.: 13/457,031

(22) Filed: Apr. 26, 2012

Related U.S. Application Data

(60) Provisional application No. 61/479,318, filed on Apr. 26, 2011.

(51) Int. Cl.
*H01L 21/764* (2006.01)
*H01L 21/20* (2006.01)
*H01L 29/49* (2006.01)
*H01L 21/02* (2006.01)
*H01L 21/203* (2006.01)
*H01L 21/762* (2006.01)
*H01L 29/06* (2006.01)

(52) U.S. Cl.
CPC ............ *H01L 29/4991* (2013.01); *H01L 21/20* (2013.01); *H01L 21/02293* (2013.01); *H01L 21/2033* (2013.01); *H01L 21/76289* (2013.01); *H01L 21/764* (2013.01); *H01L 29/0665* (2013.01); *H01L 2221/1042* (2013.01); *Y10S 977/89* (2013.01)
USPC .............. 257/522; 257/E21.09; 257/E21.092; 257/E21.573; 257/E21.581; 438/222; 438/413; 438/421; 438/429; 977/890

(58) Field of Classification Search
CPC .............. H01L 21/02293; H01L 21/20; H01L 21/2033; H01L 21/76289; H01L 21/764; H01L 29/0665; H01L 29/4991; H01L 2221/1042

USPC ............ 257/522, E21.09, E21.092, E21.573, 257/E21.581; 438/222, 413, 421, 429; 977/890
See application file for complete search history.

(56) References Cited

U.S. PATENT DOCUMENTS

| 7,579,263 B2 | 8/2009 | Han et al. |
| 2011/0186804 A1* | 8/2011 | Khayyat et al. ............... 257/9 |
| 2012/0001303 A1* | 1/2012 | Huang et al. ................. 257/623 |

OTHER PUBLICATIONS

Kim, E. et al. "Selective Epitaxial Growth of Dot Structures on Patterned Si Substrates by Gas Source Molecular Beam Epitaxy." Semicond. Sci. Technol. 14 (1999) 257-265.*
Ginige et al., "Characterization of Ge-onSi virtual substrates and single junction GaAs solar cells," Institute of Physics Publishing, Semiconductor Science and Technology, 21 (2006), 775-780.
Li et al., "Heteroepitaxy of high-quality Ge on Si by nanoscale Ge seeds grown through a thin layer of SiO2," Applied Physics Letters, 85 (2004), 1928-1930.
Ghosh et al., "Experimental and theoretical investigation of thermal stress relief during epitaxial growth of Ge on Si using air-gapped SiO2 nanotemplates," America Institute of Physics—Applied Physics Letters 99 (2011) 181911.
Park et al., "Fabrication of Low-Defectivity, Compressively Strained Ge on SiO2Ge0.8 structures using aspect ratio trapping," Journal of the Electrochemical Society, 156 (4) H249-H254 (2009).

* cited by examiner

*Primary Examiner* — Tom Thomas
*Assistant Examiner* — Christopher M Roland
(74) *Attorney, Agent, or Firm* — MH2 Technology Law Group, LLP

(57) ABSTRACT

An embodiment of the present disclosure is directed to a semiconductor device. The semiconductor devise comprises a substrate. An epitaxially grown semiconductor material is disposed over at least a portion of the substrate. A nanotemplate structure is disposed at least partially within the semiconductor material. The nanotemplate structure comprises a plurality of dielectric nanoscale features defining a plurality of nanoscale windows. An air gap is disposed between at least a portion of one or more of the nanoscale features and the semiconductor material.

11 Claims, 9 Drawing Sheets

US 8,937,366 B1

SELECTIVE EPITAXIAL OVERGROWTH COMPRISING AIR GAPS

RELATED APPLICATIONS

This application claims priority to U.S. Provisional Patent Application No. 61/479,318, filed Apr. 26, 2011, the disclosure of which is hereby incorporated by reference in its entirety.

GOVERNMENT FUNDING

This disclosure was made with Government support under Contract No. DMR-0907112 awarded by the National Science Foundation. The Government has certain rights in the invention.

DETAILED DESCRIPTION

1. Field of the Disclosure

The present disclosure is directed to a semiconductor device comprising an epitaxially grown semiconductor layer, and in particular, the use of a nanotemplate structures within the epitaxially grown semiconductor layer.

2. Background

High-quality semiconductor heterostructures, such as Ge-on-Si (GoS), have been actively pursued for many advanced applications, including near-infrared photodetectors, high-mobility field effect transistors, and virtual substrates for integrating III-V multi-junction solar cells. However, growing such heterostructures poses many engineering challenges, ranging from lattice mismatch, to thermal expansion coefficient mismatch, to non-planar morphological evolution.

For example, growing low-dislocation-density Ge on Si and subsequently integrating III-V layers present two significant engineering challenges: lattice mismatch and thermal expansion coefficient mismatch. The materials engineering solutions to circumvent the lattice mismatch include metamorphic growth, graded buffer layers, selective epitaxial overgrowth ("SEG"), and a variety of defect filtering strategies.

FIGS. 9A and 9B show TEM images of Ge grown within $SiO_2$ trenches formed by an aspect ratio trapping method. In this method, $SiO_2$ trenches are formed and Ge strips are grown between the trenches. The dislocations are trapped inside the trenches.

A self-templating growth technique, dubbed as Ge "touchdown" on Si, has been shown to relieve the stress caused by the lattice mismatch and reduce the threading dislocation density substantially below $3 \times 10^7$ cm$^{-2}$ level. A thin (<2 nm) chemical $SiO^2$ layer with nanoscale windows is used as a template in the touchdown process, as shown in FIG. 8. This process employs a nucleation and growth process that is initiated without reliance on a photolithographic mask to pattern a substrate or other layer, as discussed, for example, in U.S. Pat. No. 7,579,263, issued Aug. 25, 2009, to Sang Han et al.

In other studies, a variety of dislocation-blocking techniques are used to trap dislocations, where high-aspect-ratio windows or trenches etched through dielectric films greatly reduce the dislocation density. However, the latter technique has been demonstrated to be effective only for small holes or narrow strips with dimensions less than 1 μm.

There remains a need for a novel approach for reducing stress caused by lattice mismatch and/or reducing defect densities in.

SUMMARY

An embodiment of the present disclosure is directed to a semiconductor device. The semiconductor devise comprises a substrate. An epitaxially grown semiconductor material is disposed over at least a portion of the substrate. A nanotemplate structure is disposed at least partially within the semiconductor material. The nanotemplate structure comprises a plurality of dielectric nanoscale features defining a plurality of nanoscale windows. An air gap is disposed between at least a portion of one or more of the nanoscale features and the semiconductor material.

Another embodiment of the present disclosure is directed to a method of forming a semiconductor device. The method comprises providing a substrate. A nanotemplate structure comprising a plurality of dielectric nanoscale features defining a plurality of nanoscale windows is formed over the substrate. An epitaxial layer is deposited within the nanoscale windows and over the nanotemplate structure. The substrate is maintained at a temperature that is sufficiently high during the depositing of the epitaxial layer so that air gaps are formed between at least a portion of one or more of the dielectric nanoscale features and the epitaxial layer.

It is to be understood that both the foregoing general description and the following detailed description are exemplary and explanatory only and are not restrictive of the present teachings, as claimed.

BRIEF DESCRIPTION OF THE DRAWINGS

The accompanying drawing, which is incorporated in and constitutes a part of this specification, illustrates an embodiment of the present teachings and together with the description, serves to explain the principles of the present teachings.

DESCRIPTION OF THE EMBODIMENTS

Reference will now be made in detail to embodiments of the present teachings, examples of which are illustrated in the accompanying drawing. In the following description, reference is made to the accompanying drawing that forms a part thereof, and in which is shown by way of illustration a specific exemplary embodiment in which the present teachings may be practiced. The following description is, therefore, merely exemplary.

Figure 1:
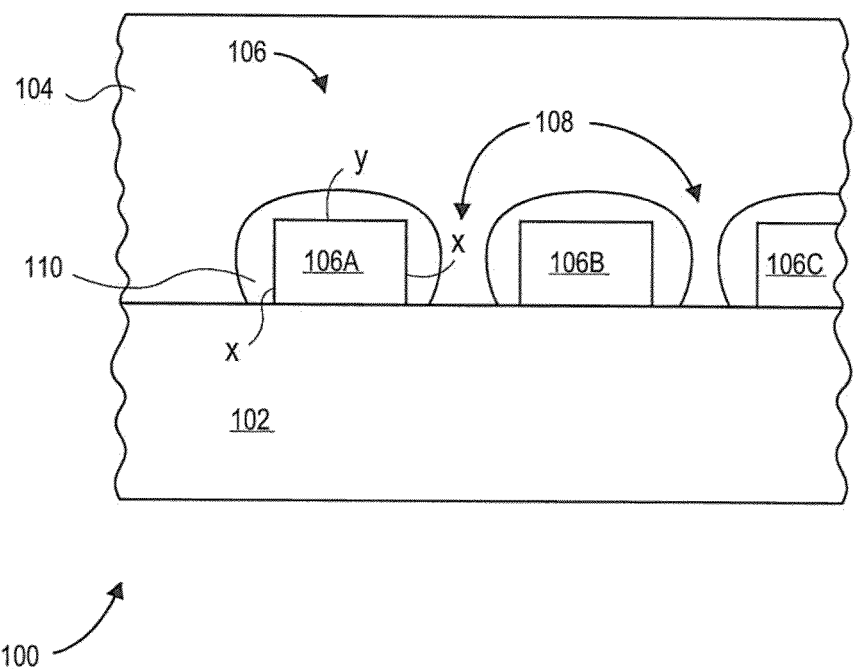
FIG. 1 illustrates a semiconductor device 100, according to an embodiment of the present disclosure.

FIG. 1 illustrates a semiconductor device 100, according to an embodiment of the present disclosure. Semiconductor device 100 includes a substrate 102. An epitaxially grown semiconductor material 104 is disposed over at least a portion of the substrate. A nanotemplate structure 106 is disposed at least partially within the semiconductor material. The nanotemplate structure 106 includes a plurality of dielectric nanoscale features 106A, 106B, 106C. The Nanoscale features 106A, 106B and 106C can be, for example, pads, lines, or walls of trenches formed by patterning the dielectric layer.

Nanoscale windows 108 are formed by the spaces between the nanoscale features 106A,106B,106C. For purposes of this disclosure, the term "window" is defined as an open area patterned in the dielectric to expose the underlying layer. The term "nanoscale" is defined as having at least one dimension that is less than 1000 nm.

The substrate 102 can comprise any material suitable for use in semiconductor devices on which an epitaxially grown layer can be formed. For example, the substrate 102 can comprise silicon, germanium, a compound semiconductor or any combination of these materials. In an embodiment, the substrate is chosen from a silicon substrate or a germanium-on-silicon substrate, both of which are well known in the art.

The semiconductor material 104 can be any epitaxially grown semiconductor material, including, for example, single crystal silicon, single crystal germanium or compound semiconductors, such as GaAs, AlAs, InP or other III-V compound semiconductors. In an embodiment, the semiconductor material 104 is epitaxially grown germanium.

The nanotemplate features 106 can be disposed partially or completely within the semiconductor material 104. As illustrated more clearly in FIG. 2B, a plurality of windows 108 are formed by the nanotemplate structure 106. In an embodiment, windows 108 are trenches formed in the dielectric. The trenches can have any suitable aspect ratio, where the aspect ratio is the height, $H_t$, to the width, $W_t$, of the trenches. An examples of suitable aspect ratios ranges from about 0.1 to about 5. In an embodiment, the nanotemplate structure 106 can be formed to provide high aspect-ratio trenches, having aspect ratios of 1 or more. In another embodiment, the aspect ratios can be less than 1.

$H_t$ and $W_t$ can have any suitable values. For example, $H_t$ can range from about 0.1 nm to about 5 microns, such as from about 10 nm to about 500 nm. $W_t$ can range from about 10 nm to about 1 micron, such as about 50 nm to about 500 nm. The width of the nanofeatures, $W_f$, can also have any suitable value. For example, $W_f$ can range from about 50 nm to about 500 nm, such as about 100 nm to about 200 nm.

An air gap 110 can be disposed between at least a portion of a nanoscale feature and the semiconductor material. In an embodiment as illustrated in FIG. 1, the air gap 110 can be disposed completely around the nanoscale feature, so that a majority of the total surface area of sidewalls, 'x', and surface 'y', of the nanoscale feature is not in contact with the semiconductor material 104, where a majority is greater than 50%. In an embodiment, the semiconductor material 104 does not substantially contact the nanoscale feature. For example, the semiconductor material 104 can contact less than 20% of the surface area of sidewalls, 'x', and surface 'y', such as a surface area ranging from about 0 to about 10% or 15%.

The nanoscale features 106A, 106B and 106C can comprise any suitable dielectric material, such as silicon oxide, silicon nitride or silicon oxynitride, or metal oxides that will allow selective epitaxial growth, such as titanium oxide, hafnium oxide, zirconium oxide or aluminum oxide. In an embodiment, the dielectric material is silicon dioxide ("$SiO_2$").

Figure 2A:
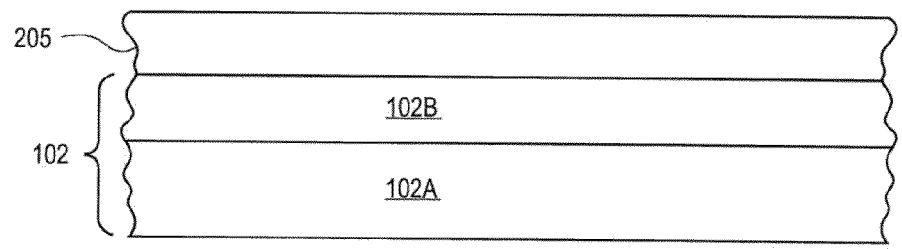
FIGS. 2A-2C illustrates a method for forming a semiconductor device, according to an embodiment of the present disclosure.

The present disclosure is also directed to a method of forming a semiconductor device. An embodiment of a method for forming a semiconductor device will now be discussed with reference to FIGS. 2A-2C and FIG. 1. The method comprises providing a suitable substrate 102, as illustrated in FIG. 2A. Any of the substrates described herein can be employed.

In an embodiment, a semiconductor layer 102b can be formed on substrate 102a. The semiconductor layer 102b can comprise, for example, single crystal silicon, single crystal germanium or compound semiconductors, such as GaAs, AlAs, InP or other III-V compound semiconductors, or any other suitable semiconductor material. In an embodiment, the substrate 102a is a single crystal silicon substrate on which a germanium layer 102b can be formed.

The semiconductor layer 102b can be formed by any suitable method. Examples of suitable methods include epitaxial growth processes, such as molecular beam epitaxial ("MBE") or MOCVD, both of which are well known in the art. In an embodiment, the method does not include forming semiconductor layer 102b as part of substrate 102.

As illustrated in FIG. 2A, a dielectric layer 205 can be formed on the substrate 102. In an embodiment, the dielectric layer can be formed by any suitable dielectric deposition process, including, for example, chemical vapor deposition processes, such as plasma enhanced chemical vapor deposition (PECVD) and low pressure chemical vapor deposition (LPCVD); atomic layer deposition; and sputter deposition. The dielectric layer 205 can be formed to any suitable thickness that is desired for forming a dielectric nanotemplate structure. Example thickness can range from about 0.1 nm to about 5 microns, such as from about 10 nm to about 500 nm.

Dielectric layer 205 can comprise any of the dielectric materials discussed herein for use as the nanoscale features, including, for example, silicon oxide, silicon nitride, silicon oxynitride and any other metal oxides that will allow for subsequent selective epitaxial growth after the dielectric is patterned, such as titanium oxide, hafnium oxide, zirconium oxide or aluminum oxide. In an embodiment, dielectric layer 205 can be a silicon dioxide layer formed by PECVD.

Figure 2B:
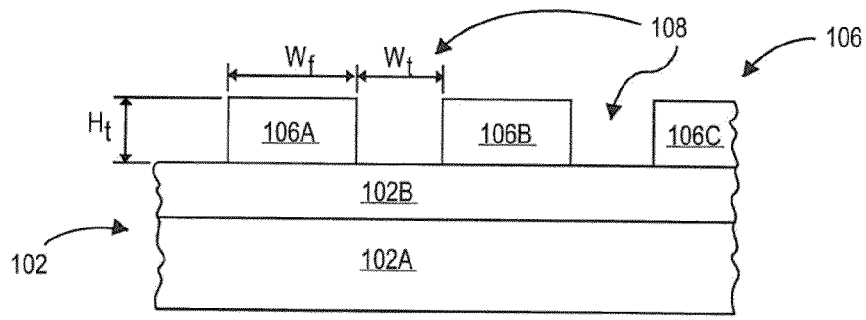

A masking and etching process can be employed to pattern the dielectric layer 205 to form the nanoscale features 106A, 106B, 106C, illustrated in FIG. 2B, according to an embodiment of the present disclosure. Suitable mask and etching processes are well known in the art and can include, for example, forming and patterning a photoresist layer (not shown) to form a photoresist mask on the dielectric layer 205; etching the dielectric layer 205; and removing the photoresist mask. Any other suitable process can be employed to pattern the dielectric layer 205.

Figure 2C:
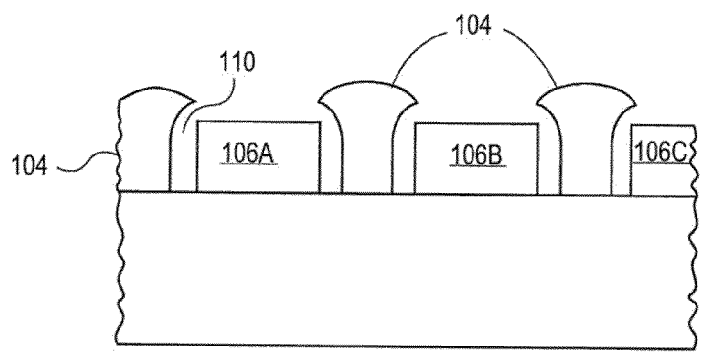

Referring to FIG. 2C, the method 200 further includes depositing epitaxially grown semiconductor material 104 within the nanoscale windows 108 and over the nanotemplate structure 106. The semiconductor material 104 coalesces around the nanoscale features 106A, 106B and 106C. FIG. 1 illustrates the epitaxially grown semiconductor material 104 after the epitaxy process is completed.

The epitaxial layer can be deposited using any suitable selective epitaxial overgrowth ("SEG") process, so that the semiconductor layer is deposited selectively within the windows. The grown can continue until the semiconductor layer grows around the nanoscale features. Examples of selective deposition processes are well known in the art, and may be accomplished using molecular beam epitaxy (MBE) or MOCVD.

It has been found that air gaps 110 can be formed between the epitaxial layer 104 and the nanoscale features 106A, 106B,106C, as illustrated in FIG. 2C and FIG. 1. The air gaps 110 can aid in mitigating stress caused by differences in thermo-expansion coefficients between different materials. Thus, the air gaps can potentially be employed to reduce stress for any heterostructure where there is a difference in thermo-expansion coefficients.

In an embodiment, air gaps 110 can be formed by depositing the epitaxial layer at temperatures that are sufficiently high. For example, the substrate temperature during epitaxial growth can be about 600° C. or above, such as temperatures ranging from about 650° C. to about 938° C.

EXAMPLES

Comparative Example 1

Ge in this comparative example was grown using molecular beam epitaxy (MBE). 5-cm diameter Si (001) substrates were boron doped with a resistivity of 1-10 ohm-cm. The Si substrates were cleaned and chemically oxidized for 5 min in a piranha bath consisting of 3 volumetric parts of $H_2SO_4$ (96 wt. %) and 1 part of $H_2O_2$ (30 wt. %) and heated at 373 K. The samples were subsequently dipped into a buffered oxide etch solution (20 parts 40 wt. % $NH_4F$:1 part 49 wt. % HF) diluted in deionized (DI) water by 6:1 volumetric ratio to remove the chemical oxide. The chemical oxidation was then repeated, and the wafer was rinsed in DI water and blown dry with $N_2$. The final chemical oxidation step was previously shown to result in a chemical oxide layer of 1.4 nm thickness.

The samples were then loaded into a deposition chamber and were degassed at 853K for 10 min. The effusion cell temperature was set to produce a flux of $6.7 \times 10^{14}$ atoms $cm^{-2}$ $s^{-1}$ (64 ML/min) and allowed to stabilize for 30 min. The substrate temperature was then increased to 1073K for 30 min to remove the chemical oxide. Next, 1 micron of Ge was deposited after lowering and stabilizing the substrate temperature to 853 K. The pressure in the chamber remained below $1.3 \times 10^{-6}$ Pa during the deposition. The Ge on Si ("GoS") samples were polished using a Logitech PM5 lapping/polishing machine on a Logitech chemcloth polishing pad. The polishing solution consisted of 50 parts of DI water and 1 part of 30 wt. % $H_2O_2$. A 60 nm thick $SiO_2$ layer was then deposited on the GoS by plasma enhanced chemical vapor deposition ("PECVD") using $SiH_4$ and $N_2O$. The $SiO_2$ was patterned into trenches along the [110] direction using interferometric lithography and reactive ion etching. The $SiO_2$ trench width and pitch were 200 and 400 nm, respectively. The patterned sample was again transferred to the deposition chamber for SEG, where an additional 1 micron of Ge was deposited at 853 K. The GoS samples were characterized using cross-sectional transmission electron microscopy ("x-TEM"), scanning electron microscopy ("SEM"), and etch pit density ("EPD") measurements.

Example 1

Samples were prepared similar to those in Comparative Example 1, except that both Ge deposition steps occurred after lowering and stabilizing the substrate temperature to 923 K (650° C.), instead of 853 K (583° C.).

Figure 3B:
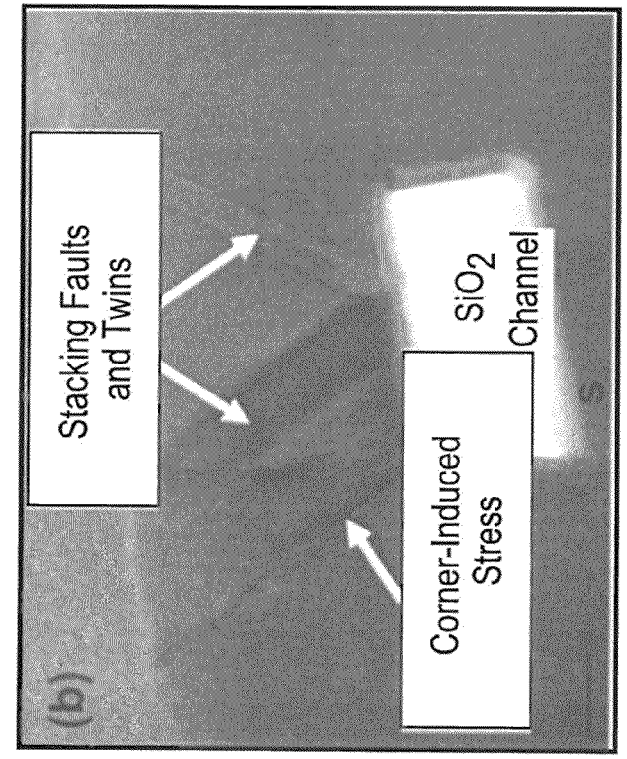
FIG. 3B shows the formation of stacking faults and twins on top of $SiO_2$ channels due to coalescence of adjacent Ge islands.
Figure 3A:
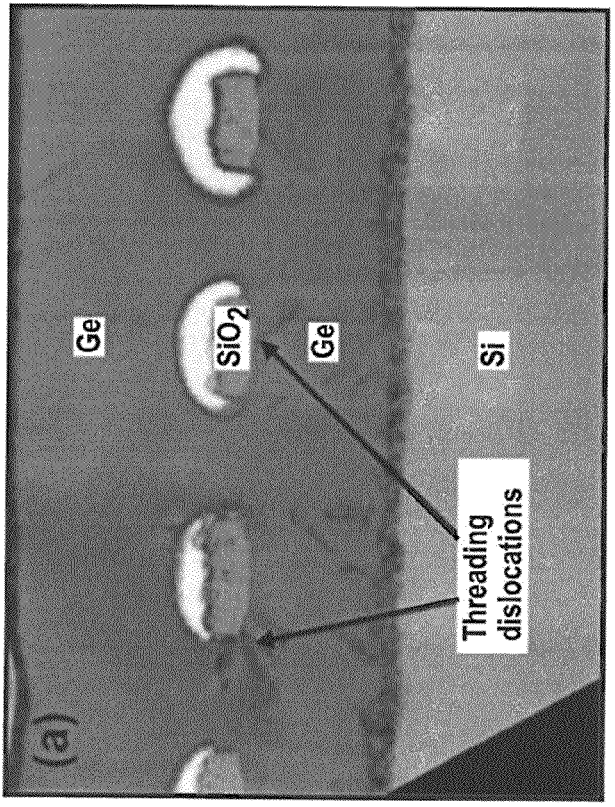
FIG. 3A shows a TEM image of threading dislocations blocked by $SiO_2$ nanochannels.

FIGS. 3A and 3B show x-TEM images that were taken of the structures containing the $SiO_2$ nanotemplates formed in Example 1 (FIG. 3A) and Comparative Example 1 (FIG. 3B). The estimated threading dislocation density (TDD) in the Ge layer below the oxide template was about $9 \times 10^{10}$ $cm^{-2}$. Most TDs were blocked by the oxide template and did not propagate into the upper SEG Ge layer. The x-TEM images of FIG. 3A also showed that voids (or air gaps) formed around the sidewalls and top of the oxide template during Ge SEG at 923 K. In contrast, FIG. 3B showed that voids did not form over the oxide template during Ge SEG at 853 K.

Figure 4B:
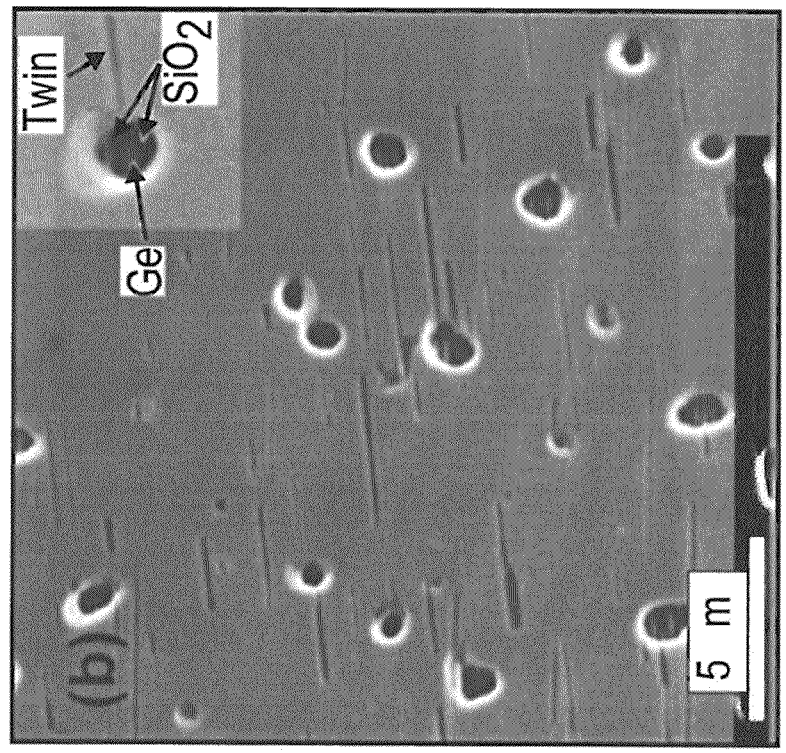
FIG. 4B shows a scanning electron micrograph of epitaxial Ge film grown via $SiO_2$ trenches on Ge-on-oxidized Si film etched for 30 s revealing etch pits.
Figure 4A:
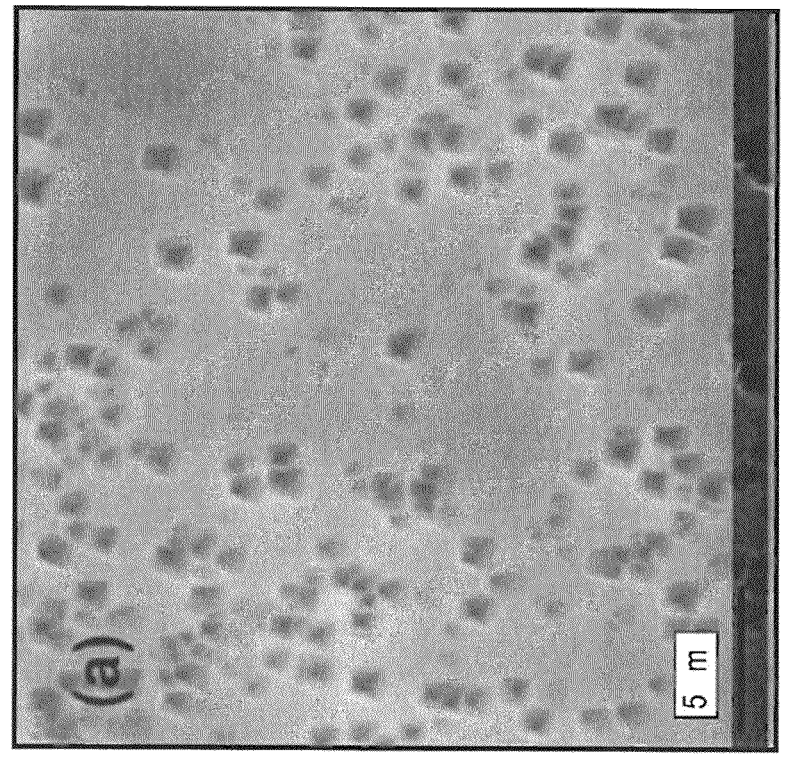
FIG. 4A shows a scanning electron micrograph of annealed Ge-on-oxidized Si film, etched for 30 s revealing square shaped etch pits.

Twins and stacking faults (SFs) were present in both TEM images of Examples 1 and 2 irrespective of formation of voids over the oxide template. The EPD of the GoS substrate and the Ge epilayer coalesced over the $SiO_2$ template on GoS are shown in FIGS. 4A and 4B. Square shaped pits shown in FIG. 4A corresponded to TDs with a density of $1.1 \times 10^8$ $cm^{-2}$ that intersects the film surface. The TDD in FIG. 4B was $1.6 \times 10^7$ $cm^{-2}$. The rectilinear pits correspond to twins and SFs aligned with [110] that propagate to the film surface. The density of twins/SFs in the sample was $2.8 \times 10^7$ $cm^{-2}$. The twins also showed the same preferential alignment along the [110] oxide template. It is believed that the large circular openings in FIG. 4B were due to incomplete coalescence of the Ge SEG. The large opening shown in the inset of FIG. 4B reveals the location of a twin defect that exists directly over top center of the $SiO_2$.

The air-gapped $SiO_2$ nanotemplate structure was thought to reduce the thermal stress caused by TEC mismatch between Ge and Si and to simultaneously filter the TDs. The total defect density in the coalesced Ge film, which consists of TDs and a combination of twins and SFs, is about $2.8 \times 10^7$ $cm^{-2}$. While twins and SFs form during Ge coalescence over the $SiO_2$ template, the use of $SiO_2$ template in combination with SEG reduces the TDD above the $SiO_2$ template by nearly 2 orders of magnitude compared to the Ge layer beneath the template, as reported in the publication entitled, "Experimental and theoretical investigation of thermal stress relief during epitaxial growth of GE on Si using air-gapped $SiO_2$ nanotemplates," authored by the current inventors, Applied Physics Letters 99, 181911 (2011), the disclosure of which is hereby incorporated by reference in its entirety.

Example 2—Simulations

A finite element modeling (FEM) stress analysis was performed that further corroborates the stress relief mechanism described above. The modeling was accomplished using COMSOL Multiphysics Structural Mechanics Module, which is commercially available from COMSOL INC., of Palo Alto, Calif.

Figure 5B:
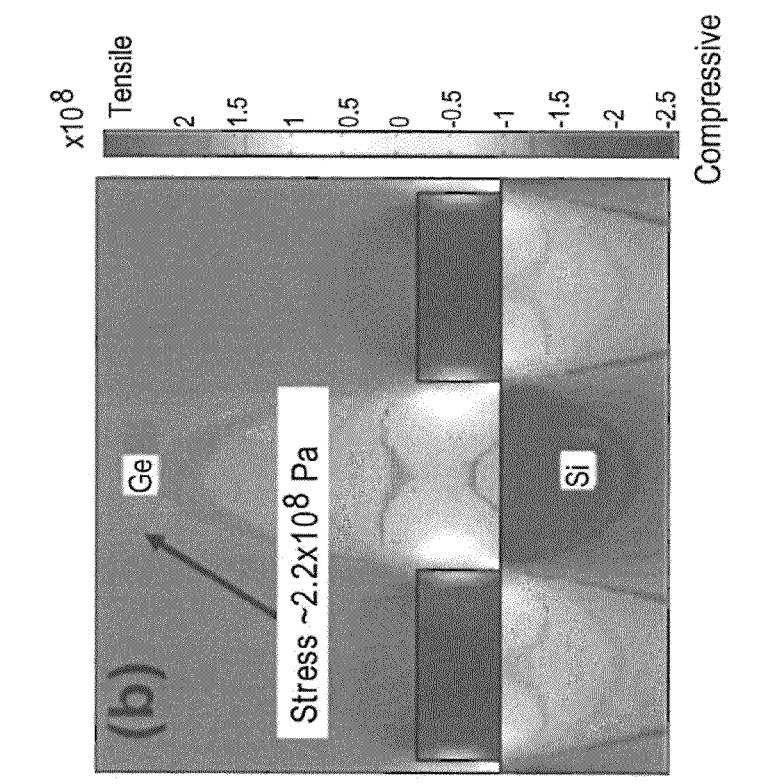
FIG. 5B shows results of simulation of stress of epi-Ge grown within 200 nm by 200 nm $SiO_2$ trenches on Si in aspect ratio trapping method.
Figure 5A:
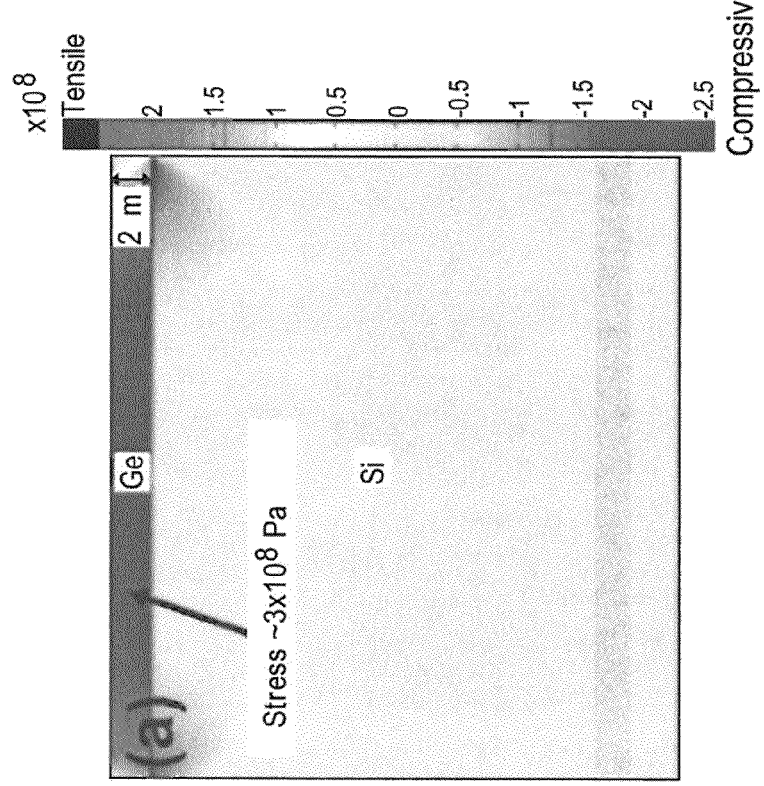
FIG. 5A shows simulated in-plane stress in directly grown epi-Ge on Si.

FIG. 5A shows simulated in-plane stress in epitaxially grown Ge deposited directly on Si. The in-plane bi-axial tensile stress was about $3 \times 10^8$ Pa. The Ge was tensily stressed due to thermal expansion coefficient mismatch between the Ge and Si. FIG. 5B shows the simulated stress of epi-Ge grown within 200 nm by 200 nm $SiO_2$ trenches on Si in an aspect ratio trapping method. In-plane bi-axial tensile stress was about 2.8×10$^8$, which was reduced compared to that of the FIG. 5A simulated example.

Figures 6A, 6B:
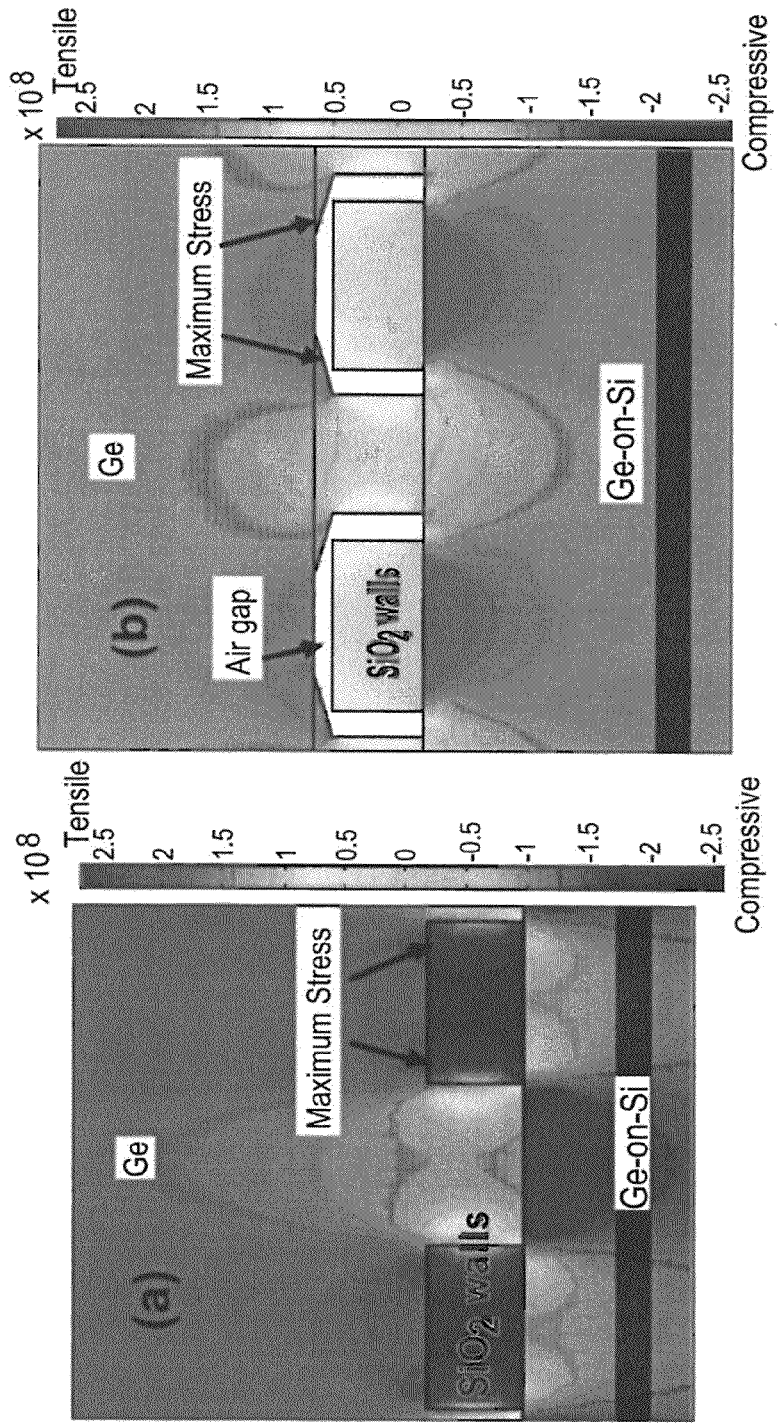
FIG. 6A shows a simulated in-plane, bi-axial stress in epi-Ge grown via 200-nm-opening $SiO_2$ nanotemplates fabricated on Ge-on-Si.
FIG. 6B shows the results of a simulation of stress of epi-Ge grown via 200-nm-opening $SiO_2$ nanotemplates fabricated on Ge-on-Si.

FIG. 6A shows simulated in-plane, bi-axial stress in epi-Ge grown without air-gaps via 200-nm-opening SiO$_2$ nanotemplates fabricated on Ge-on-Si. Corner-induced stress was observed above the nanotemplate's in this Comparative Example.

FIG. 6B shows the resulting stress of epi-Ge grown with air-gaps via 200-nm-opening SiO$_2$ nanotemplates fabricated on Ge-on-Si, which is exemplary of the devices of the present disclosure. The epi-Ge in the of FIG. 6B coalesces over the nanotemplate, resulting in the air-gap formation. Unlike the FIG. 6A Comparative Example, corner induced stress was not observed in the devices of Example 1.

Figure 7:
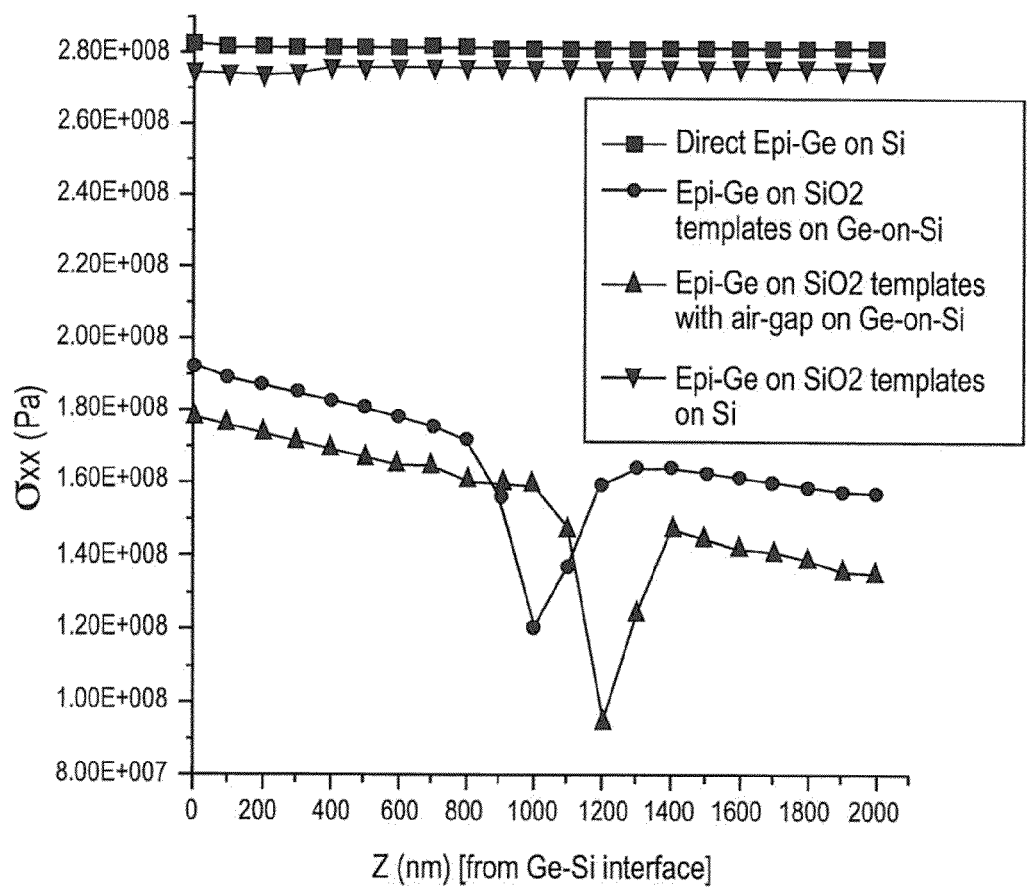
FIG. 7 shows comparison data of in-plane, bi-axial stress values along the z-directions for different Ge-template architectures on Si substrates.
Figure 8:
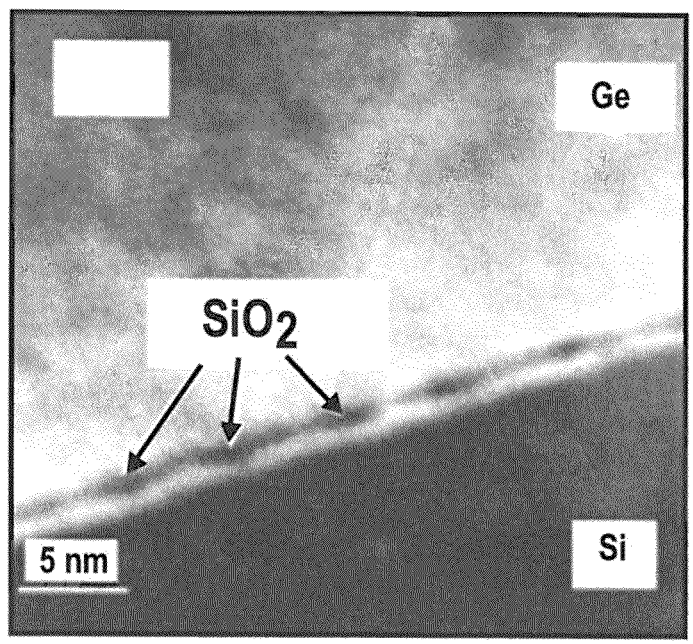
FIG. 8 illustrates a thin (<2 nm) chemical $SiO_2$ layer with nanoscale windows used as a template in a touchdown process.
Figures 9A, 9B:
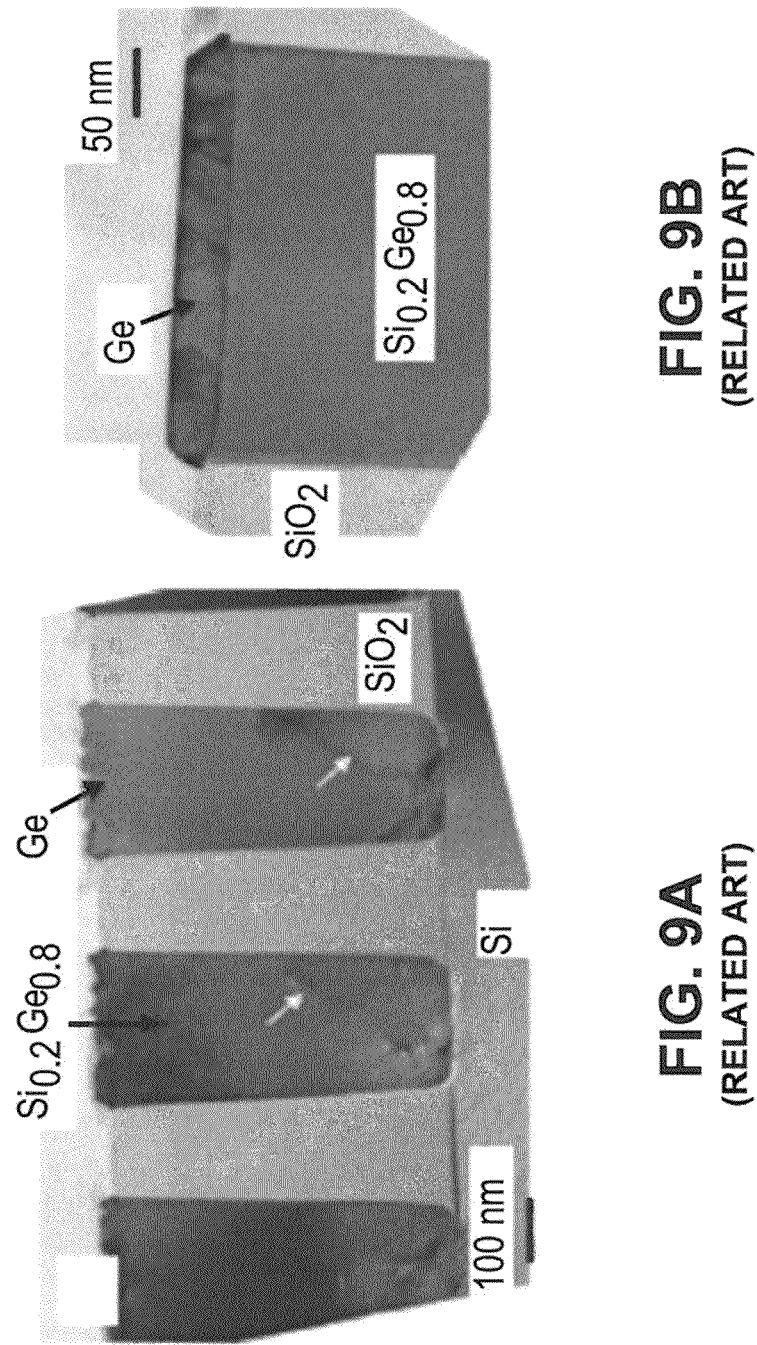
FIGS. 9A and 9B show TEM images of Ge grown within $SiO_2$ trenches formed by an aspect ratio trapping method It should be noted that some details of the figure have been simplified and are drawn to facilitate understanding of the embodiments rather than to maintain strict structural accuracy, detail, and scale.

FIG. 7 shows a comparison of the simulated in-plane, bi-axial stress values along the z-directions for the different SiO$_2$-template architectures shown in FIGS. 5 and 6. As shown in FIG. 7, the SiO$_2$ templates provide for reduced bi-axial stress in the Ge layer compared to an epitaxially formed Ge layer formed directly on silicon. The epitaxially formed germanium layers formed on Ge on Si substrates had significantly reduced bi-axial stress compared to the devices of FIGS. 5A and 5B. The simulated example device employing air-gaps of FIG. 6B had the lowest stress.

The dielectric nanotemplate structures of the present disclosure provided one or more of the following advantages: blocking the threading dislocations and reduce the thermal stress due to thermal expansion coefficient mismatch between Ge and Si; reduce the etch pit density compared to the etch pit densities observed on the Ge grown directly on Si; the use of a dielectric nanotemplate in combination with selective epitaxial growth ("SEG") reduced the threading dislocation density ("TDD") above the SiO$_2$ template by nearly two orders of magnitude compared to the Ge layer beneath the template.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein.

While the present teachings have been illustrated with respect to one or more implementations, alterations and/or modifications can be made to the illustrated examples without departing from the spirit and scope of the appended claims. In addition, while a particular feature of the present teachings may have been disclosed with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." Further, in the discussion and claims herein, the term "about" indicates that the value listed may be somewhat altered, as long as the alteration does not result in nonconformance of the process or structure to the illustrated embodiment. Finally, "exemplary" indicates the description is used as an example, rather than implying that it is an ideal.

Other embodiments of the present teachings will be apparent to those skilled in the art from consideration of the specification and practice of the present teachings disclosed herein. It is intended that the specification and examples be considered as exemplary only, with a true scope and spirit of the present teachings being indicated by the following claims.

What is claimed is:

1. A method of forming a semiconductor device, the method comprising:
    providing a substrate;
    forming a nanotemplate structure comprising a plurality of dielectric nanoscale features defining a plurality of nanoscale windows over the substrate, the dielectric nanoscale features each having a top surface and side surfaces, a plurality of trenches being formed between the dielectric nanoscale features; and
    depositing an epitaxial layer within the trenches, the epitaxial layer coalescing over the top surface of the nanoscale features to form a continuous epitaxial layer over the dielectric nanotemplate structure, wherein the temperature of the substrate is maintained at a temperature that is sufficiently high during the depositing of the epitaxial layer so that air gaps are formed between at least the top surface of the dielectric nanoscale features and the epitaxial layer.

2. The method of claim 1, wherein forming the nanotemplate structure comprises:
    depositing a dielectric layer;
    forming a lithographic mask over the dielectric layer;
    etching the dielectric layer; and
    removing the lithographic mask.

3. The method of claim 1, wherein the dielectric layer is deposited using a process chosen from chemical vapor deposition, atomic layer deposition, and sputter deposition.

4. The method of claim 3, wherein the dielectric layer is deposited by plasma enhanced chemical vapor deposition.

5. The semiconductor device of claim 3, wherein the dielectric nanoscale features comprise a metal oxide.

6. The semiconductor device of claim 3, wherein the dielectric nanoscale features comprise a material chosen from silicon oxide, silicon nitride, silicon oxynitride, titanium oxide, hafnium oxide, zirconium oxide and aluminum oxide.

7. The method of claim 1, wherein the epitaxial layer is deposited using selective epitaxial overgrowth.

8. The method of claim 1, wherein the epitaxial layer comprises germanium, and the temperature of the substrate is 600° C. or higher.

9. The method of claim 1, wherein the epitaxial layer comprises germanium, and the temperature of the substrate ranges from about 600° C. to about 938° C.

10. The method of claim 1, wherein the epitaxial layer comprises germanium, and the deposition temperature ranges from about 650° C. to about 938° C.

11. The method of claim 1, wherein the air gaps are disposed around the nanoscale features so that a majority of a total surface area of the sidewalls of each nanoscale feature are not in contact with the epitaxial layer.

* * * * *